(12) United States Patent
Konno et al.

(10) Patent No.: US 7,294,833 B2
(45) Date of Patent: Nov. 13, 2007

(54) METHOD OF ALIGNMENT FOR EFFICIENT DEFECT REVIEW

(75) Inventors: Takehiko Konno, Mito (JP); Hiroshi Miyai, Hitachi (JP)

(73) Assignees: Hitachi High-Technologies Corporation, Tokyo (JP); Hitachi Science Systems Ltd., Ibaraki (JP)

( * ) Notice: Subject to any disclaimer, the term of this patent is extended or adjusted under 35 U.S.C. 154(b) by 24 days.

(21) Appl. No.: 10/847,885

(22) Filed: May 19, 2004

(65) Prior Publication Data

US 2004/0232332 A1    Nov. 25, 2004

(30) Foreign Application Priority Data

May 23, 2003    (JP)    ............... 2003-145600

(51) Int. Cl.
    *H01J 37/28*    (2006.01)
(52) U.S. Cl. .................... 250/310; 250/491.1
(58) Field of Classification Search .......... 250/310
    See application file for complete search history.

(56) References Cited

U.S. PATENT DOCUMENTS 6,566,654 B1    5/2003    Funatsu et al.

2003/0058444 A1*    3/2003    Nara et al. ............ 356/394
2003/0063792 A1*    4/2003    Hiroi et al. ............ 382/149

FOREIGN PATENT DOCUMENTS

JP    P2000-232138 A    8/2000
JP    P2001-127125 A    5/2001

* cited by examiner

*Primary Examiner*—Nikita Wells
*Assistant Examiner*—James J Leybourne
(74) *Attorney, Agent, or Firm*—McDermott Will & Emery LLP (57) ABSTRACT

An inspection system includes a SEM visual inspection apparatus for detecting a defect in a semiconductor sample in steps of manufacturing a semiconductor device and a review apparatus for observing, at a high resolution, the defect in the semiconductor sample detected by the SEM visual inspection apparatus. The system has a function of transmitting an alignment dictionary image as one of alignment parameters to be set by the SEM visual inspection apparatus using an inspection recipe to the review apparatus.

5 Claims, 7 Drawing Sheets

METHOD OF ALIGNMENT FOR EFFICIENT DEFECT REVIEW

INCORPORATION BY REFERENCE

The present application claims priority from Japanese application JP2003-145600 filed on May 23, 2003, the content of which is hereby incorporated by reference into this application.

BACKGROUND OF THE INVENTION

The present invention relates to a visual inspection apparatus using a scanning electron microscope (SEM), a review apparatus, and an alignment coordinate setting method for use in defect coordinate alignment, which are applied to steps of manufacturing a semiconductor device to observe a defective part in a semiconductor sample detected by the SEM visual inspection apparatus with use of the review apparatus with a high resolution.

A semiconductor device is formed after a semiconductor sample undergoes a plurality of steps of oxidization, film deposition, light exposure, etching, etc. The semiconductor sample is inspected as necessary in the midway of the plurality of steps with use of an inspection apparatus such as a foreign matter inspection apparatus or a visual inspection apparatus. And coordinate information about a foreign matter or visually defective part in the semiconductor sample is transmitted to a review apparatus via a network or the like for high-resolution observation.

A SEM visual inspection apparatus, which is a scanning electron microscope (SEM) for scanning an electron beam across a semiconductor sample applied to an inspection apparatus, is featured by detecting an electrical defect such as a contact failure in a hole step, disconnection or short-circuiting in a wiring step, which could not be detected by an optical inspection apparatus. In the SEM visual inspection apparatus, patterns on the semiconductor sample to be inspected are irradiated with an electron beam, secondary electrons emitted in response to various materials of the patterns are detected, the amount of detected secondary electrons is converted to gray scale to thereby form an image, the formed image is stored in an image processing memory in the apparatus, patterns repeated at intervals of several microns in the chip or patterns at the same locations of adjacent chips are mutually compared with the stored image, and the location where a difference of the patterns is found is extracted as a defective part. In the SEM visual inspection apparatus including an optical microscope, rough alignment of the semiconductor sample is carried out using the optical microscope, while fine alignment is carried out based on the SEM image.

After completing the inspection, the apparatus expressed coordinate information on the detected defective part by a chip layout number and an in-chip coordinate, and then transmits the coordinate information as an inspected result, together with chip layout information and semiconductor sample alignment information relating to the semiconductor sample and prepared using an inspection recipe, to the review apparatus via a network or the like.

The review apparatus, on the basis of the inspected result received from the SEM visual inspection apparatus, displays a chip layout of the semiconductor sample to be observed and a coordinate map of the defective part detected by the visual inspection apparatus, and prepares a defect coordinate list. A defect coordinate includes the layout number of the chip containing the defect in the semiconductor sample and an ordinate in the chip. In the review apparatus, the relative coordinate of the defect present in the semiconductor sample and detected by the SEM visual inspection apparatus is set at the time point that the review apparatus reads the inspected result received from the SEM visual inspection apparatus. However, the defect present in the semiconductor sample cannot be observed only by setting the relative coordinate of the defect present in the semiconductor sample. This means that a distance was set between a defect detected at a position and a defect detected at another position. When coordinate alignment is not conducted between the SEM visual inspection apparatus and the review apparatus, however, the review apparatus cannot move its stage to the coordinate of the defect in the semiconductor sample detected by the SEM visual inspection apparatus. To realize this, the coordinate alignment information on the semiconductor sample is transmitted from the SEM visual inspection apparatus to the review apparatus, which in turn moves the stage to the target coordinate of the defect on the basis of the coordinate alignment information.

In the first processing step of the alignment of the review apparatus, the review apparatus refers to the inspected result received from the SEM visual inspection apparatus, and moves the stage to the alignment coordinate specified in the SEM image by the SEM visual inspection apparatus under automatic control. However, due to a difference in the amount of rotation of the semiconductor sample fixed in each sample holders or a difference in the set center coordinates between the SEM visual inspection apparatus and the review apparatus, the review apparatus cannot move the stage to the alignment point in the SEM image specified by the SEM apparatus with a high possibility. In the review apparatus, further, since searching for the first alignment point is carried out based on the optical microscope image, it is difficult to identify the alignment point specified in the SEM image. For such a reason, when the review apparatus do the alignment, without an instruction from the operator of the SEM visual inspection apparatus or without data indicative of the alignment point specified by the SEM visual inspection apparatus, a working efficiency drops.

There is known an apparatus in which a visually-recognizable mark is made on a semiconductor sample by ink jet, laser machining or sputtering (e.g., refer to JP-A-2000-232138) or a system in which a mark is made by an electron beam in the vicinity of a defect in a semiconductor sample (e.g., refer to JP-A-2001-127125 corresponding to U.S. Pat. No. 6,566,654).

Further, even when the same operator operates the SEM visual inspection apparatus and the review apparatus, the operator may erroneously specify an alignment point from his misunderstanding. Thus there may occur such a situation that the operator cannot move the stage to the coordinate of the defect detected by the SEM visual inspection apparatus. In this case, the operator is required to again load the sample in the SEM visual inspection apparatus to confirm the alignment point.

In the above prior art, when the defect in the semiconductor sample detected by the SEM visual inspection apparatus is observed using the review apparatus with a high resolution, information transmission of the coordinate alignment of the detected defect, so called alignment point specification has been conducted frequently manually. For this reason, the inspection system in semiconductor manufacturing steps had a low working efficiency and a low reliability.

SUMMARY OF THE INVENTION

It is therefore an object of the present invention to provide an inspection system in which an operator can easily and reliably observe a defect detected by a SEM visual inspection apparatus at a high resolution using a review apparatus and also can easily track down the cause of the defect in the semiconductor sample.

In accordance with an aspect of the present invention, the above object is attained by a SEM visual inspection apparatus having a function of transmitting an alignment dictionary image to a review apparatus, and by the review apparatus having a function of displaying the alignment dictionary image received from the SEM visual inspection apparatus on an apparatus display device.

The SEM visual inspection apparatus also has a function of searching the alignment dictionary image to be transmitted to the review apparatus for an alignment center position and applying a mark indicative of the alignment center position thereto.

The SEM visual inspection apparatus also has a function of transmitting to the review apparatus an alignment coordinate of an optical microscope image at a first alignment point, an alignment coordinate of the optical microscope image at a second alignment point, and offset information from the alignment coordinate of the optical microscope image to the alignment coordinate of a SEM image. For searching for the alignment point, the review apparatus has a function of starting the searching the alignment coordinate of the optical microscope image with a low display magnification. The alignment coordinate of the optical microscope is received from the SEM visual inspection apparatus. The review apparatus also has a function of moving the stage to the alignment point of the SEM image under automatic control on the basis of the offset information from the alignment coordinate of the optical microscope image received from the SEM visual inspection apparatus to the alignment coordinate of the SEM image.

Other objects, features and advantages of the invention will become apparent from the following description of the embodiments of the invention taken in conjunction with the accompanying drawings.

DESCRIPTION OF THE EMBODIMENTS

As has been explained above, when the user observes a defect on the review apparatus, he is required to conduct coordinate alignment on the basis of the coordinate of the defect in the semiconductor sample set in the SEM visual inspection apparatus which detected the defect. At this time, the coordinate alignment in the review apparatus is implemented by conducting the alignment with the same pattern as that used for the alignment of the SEM image in the SEM visual inspection apparatus. The reasons why the coordinate alignment in the review apparatus is implemented by conducting the alignment with the same pattern as that used for the alignment of the SEM image in the SEM visual inspection apparatus, are as follows. On a usual semiconductor-device manufacturing line, when semiconductor devices are of an identical type, a pattern and coordinate origin for use in the alignment are standardized. Thus when an inspected result of the optical inspection apparatus is reviewed, a predetermined point is specified for the alignment pattern and coordinate origin. However, the alignment in the SEM visual inspection apparatus is required to be carried out eventually based on the SEM image. For this reason, even when the samples are of one type but have different steps, there exists such a pattern that cannot be observed with the SEM image, which blocks the standardization of the alignment patterns. Further, the coordinate origin or so-called chip origin of the defect detected by the SEM visual inspection apparatus is set with an offset distance from the alignment coordinate of the SEM image, and the offset information is applied even to the review apparatus. Thus, the specification of the coordinate alignment pattern in the review apparatus is also required to be made eventually based on the SEM image.

Figure 1:
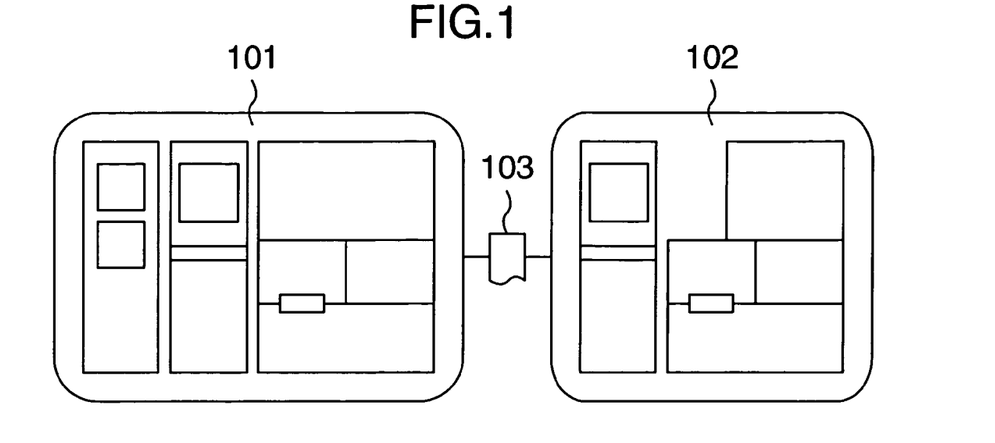
FIG. 1 shows an arrangement of an inspection system.

FIG. 1 is an arrangement of an inspection system in accordance with an embodiment of the present invention. The inspection system includes a SEM visual inspection apparatus 101 and a review apparatus 102. The SEM visual inspection apparatus 101 inspects a semiconductor example; detects a defect in the semiconductor sample; and transmits an inspected result 103 to the review apparatus 102 via a network or a recording medium. The review apparatus 102 refers to the inspected result 103 received from the SEM visual inspection apparatus 101 and observes the defect in the semiconductor sample at a a high resolution.

Figure 2:
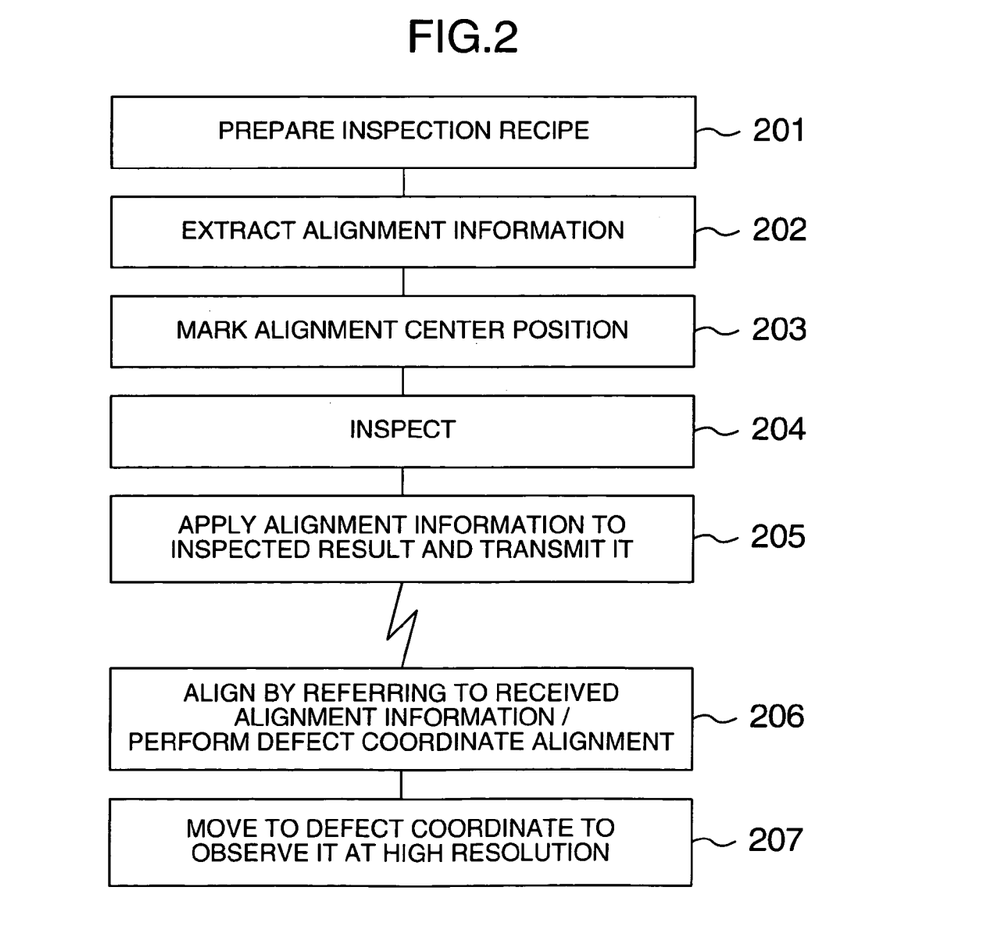
FIG. 2 is a flow chart showing processing operations of the inspection system.

Explanation will next be made as to processing steps of the inspection system from detection of the defect in the semiconductor sample to high-resolution observation of the defect. FIG. 2 is a flow chart showing a flow of processing operations of the inspection system from detection of a defect in a semiconductor sample to high-resolution observation of the defect. In the flow chart of FIG. 2, processing steps 201 to 205 show processing operations to be carried out by the SEM visual inspection apparatus. In the step 201, an inspection recipe, in which chip layout information on semiconductor samples, alignment parameters, inspection conditions, etc. are set, is prepared. In the step 202, alignment information is extracted from the alignment parameters set in the inspection recipe to be transmitted to the review apparatus. In the step 203, marking operation is carried out to apply a mark indicative of an alignment center position to an optical microscope image and an alignment dictionary image of the SEM image as one of the alignment information extracted in the step 202. In the step 204, inspection is carried out on the basis of the inspection recipe prepared in the step 201. In the step 205, the alignment information prepared in the steps 202 and 203 and an inspected result obtained in the step 204 are transmitted to the review apparatus. The operations of the above steps correspond to the operations of the SEM visual inspection apparatus. Processing steps 206 and 207 in FIG. 2 correspond to the operations of the review apparatus. In the step 206, the review apparatus refers to the alignment information received from the SEM visual inspection apparatus in the step 205, and performs alignment with the same point as the alignment point set in the SEM visual inspection apparatus for coordinate alignment of the semiconductor sample. In the step 207, the review apparatus refers to the inspected result of the step 205 received from the SEM visual inspection apparatus, and moves a stage to a defect coordinate of the semiconductor sample for high-resolution observation.

In the processing flow shown in FIG. 2, the operations of the defect coordinate alignment carried out by the SEM visual inspection apparatus and review apparatus, that is, the operations of the steps 202, 203, 205 and 206 form the operation of the present invention. Explanation will next be made in detail as to how to set alignment in the present invention.

Explanation will first be made as to the extracting operation of the alignment information of the SEM visual inspection apparatus in the step 202 and to the alignment center-position marking operation in the step 203.

Figure 3:
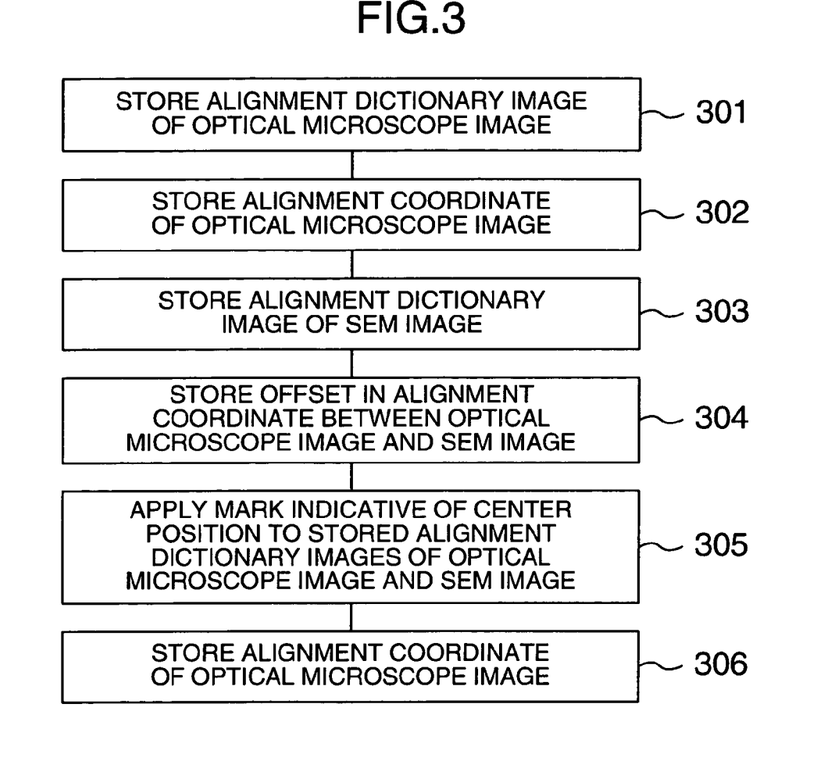
FIG. 3 is a flow chart showing alignment operations of a SEM visual inspection apparatus.
Figure 4:
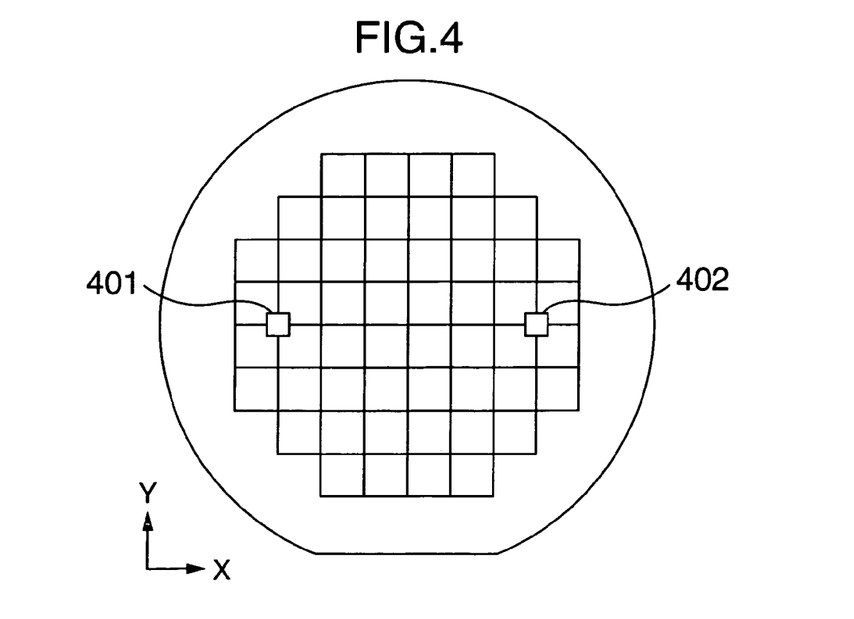
FIG. 4 shows a plain view of a semiconductor sample.

FIG. 3 is a flow chart showing details of the operation (of extracting the alignment information of the SEM visual inspection apparatus) of the step 202. FIG. 4 is a plain view of a semiconductor sample. In the illustrated example, alignment information to be transmitted to the review apparatus is extracted from alignment parameters used in the inspection recipe of the SEM visual inspection apparatus. The extracted alignment information includes alignment image information and alignment coordinate information at first and second alignment points 401 and 402 shown in FIG. 4. In this case, the alignment image information indicates an optical microscope image and a scanning electron microscope (SEM) image. The first and second alignment points 401 and 402 as used herein are the same coordinate points in respective two chips spaced by a sufficient distance from each other in one direction, for example, as shown in FIG. 4.

In FIG. 3, processing steps 301 to 305 show operations at the first alignment point 401. In the step 301, an alignment dictionary image of the optical microscope image is stored. In the step 302, an alignment coordinate of the optical microscope image is stored. More specifically, the SEM visual inspection apparatus moves the stage to the first alignment point 401, selects, for example, an alignment pattern 503 of the optical microscope image on an optical microscope image display screen 502 in a display device 501 of the SEM visual inspection apparatus, and registers an alignment dictionary image 601 of the optical microscope image. At this time, the center position of the registered alignment dictionary image 601 of the optical microscope image is stored as an alignment coordinate 602 of the optical microscope image.

Figure 5:
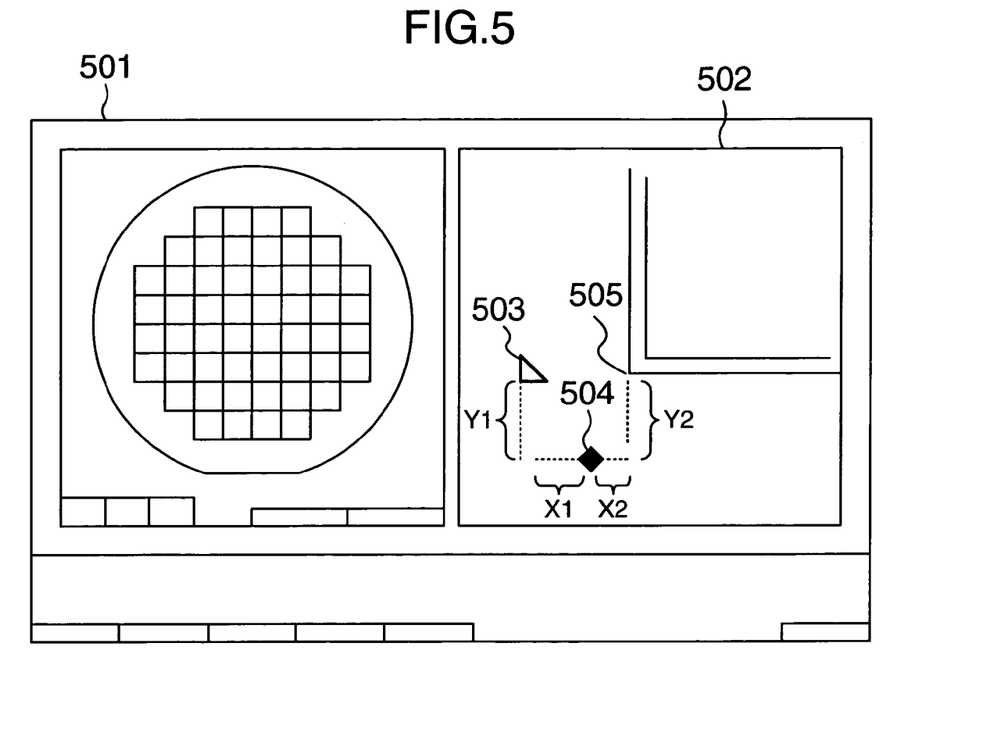
FIG. 5 shows an exemplary display of a display device in the SEM visual inspection apparatus.
Figure 7:
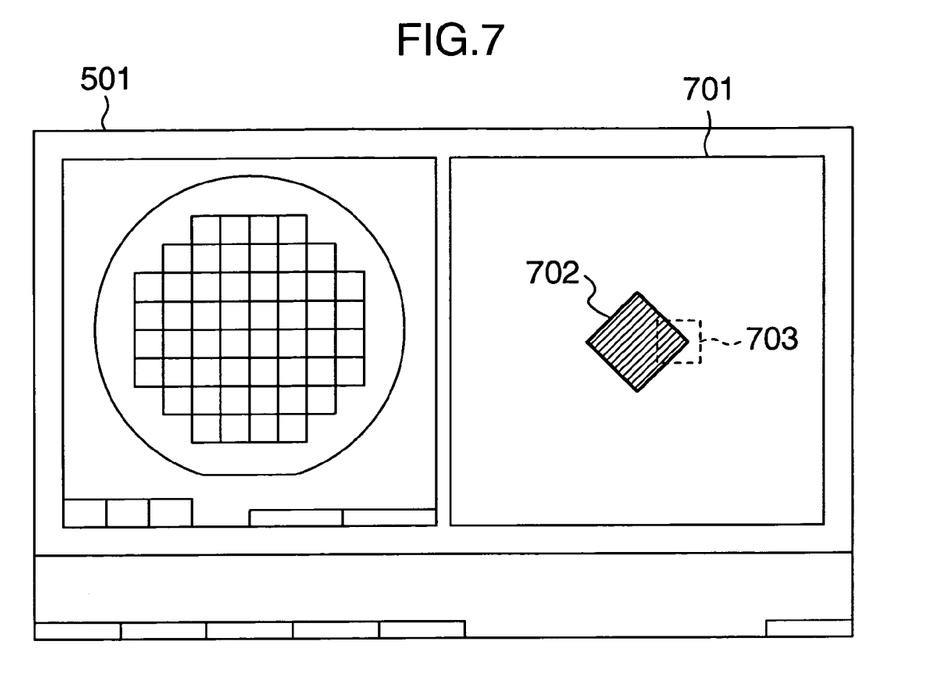
FIG. 7 shows another exemplary display of the display device in the SEM visual inspection apparatus.
Figure 8:
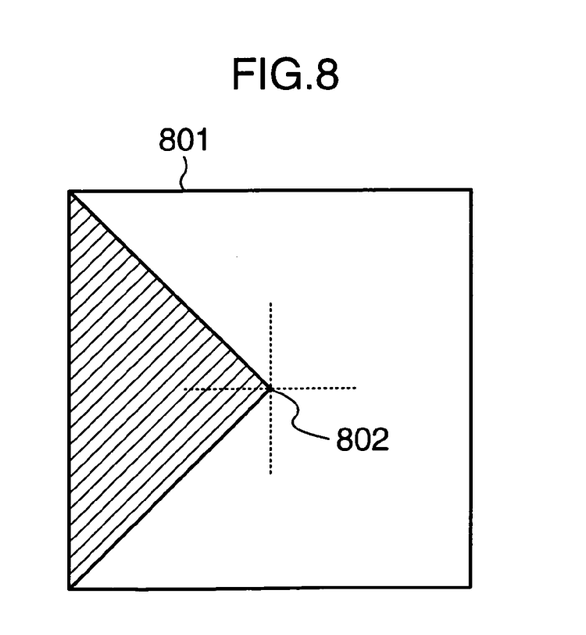
FIG. 8 is an enlargement of part of FIG. 7.

In the next step 303, the alignment dictionary image of the SEM image is stored. At this time, if the pattern of the alignment dictionary image 601 of the optical microscope image stored in the step 301 can be observed even in the SEM image, then the same pattern is used. When the pattern cannot be observed in the SEM image or when the image has a low contrast, however, the SEM visual inspection apparatus moves the stage, searches for an observable SEM image pattern having a high image contrast, and stores the alignment dictionary image of the SEM image. For example, when an alignment pattern 504 of the SEM image present in the optical microscope image display screen 502 can be observed even on a SEM image display screen 701, a pattern 702 is used as the alignment pattern of the SEM image. At this time, since the SEM image has a large image display magnification, the pattern 702 is larger, in many cases, than an area 703 used by the alignment dictionary image. In such a case, it is desirable that, for example, such an image at a corner of the pattern that can avoid pattern mismatching be used as an alignment dictionary image 801 of the SEM image. When the alignment dictionary image of the SEM image is registered, the center position of the dictionary image is registered as an alignment coordinate 802 of the SEM image.

Figure 6:
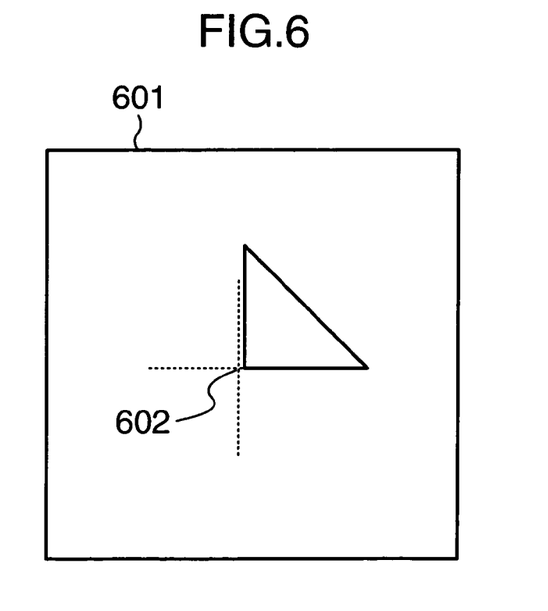
FIG. 6 is an enlargement of part of FIG. 5.

At this time, an offset from the alignment coordinate 602 of the optical microscope image shown in the step 304 to the alignment coordinate 802 of the SEM image is stored. FIG. 5 shows an exemplary display on the display device of the SEM visual inspection apparatus, in which the offset is shown by X1 and Y1. Thereafter, when the user specifies a chip origin 505, an offset distance (X2 and Y2 in FIG. 5, in other words) from the alignment coordinate 802 of the SEM image to the chip origin 505 (coordinate origin) is stored.

In the step 305, marking operation is carried out to apply a mark to the optical microscope image and the alignment dictionary image of the SEM image stored in the steps 301 and 303 to indicate an alignment center position. In this connection, the alignment dictionary image to be subjected to the marking operation corresponds to the optical microscope image and the SEM image.

Figure 9:
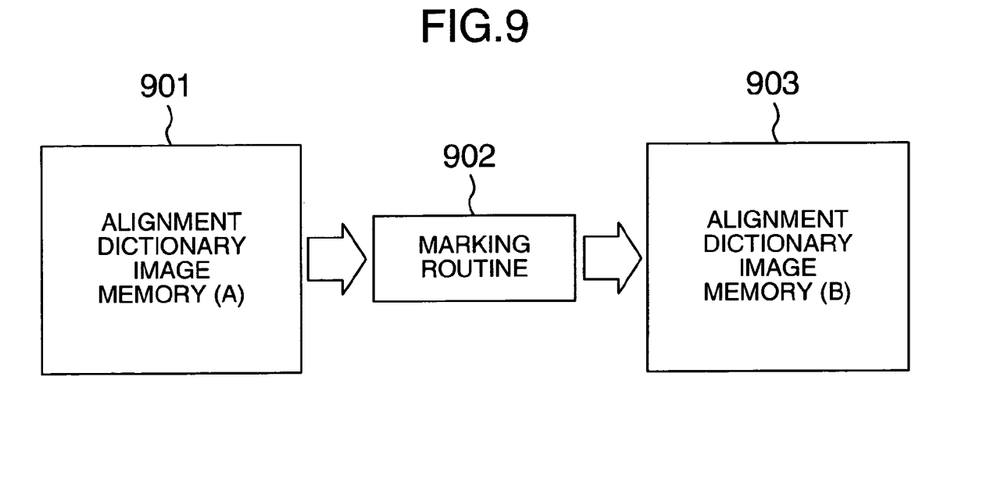
FIG. 9 is a functional block diagram showing processing operations of an alignment dictionary image.

FIG. 9 is a functional block diagram showing a flow of data of the alignment dictionary image during the alignment center-position marking operation. The SEM visual inspection apparatus stores the alignment dictionary image for use in alignment in an alignment dictionary image memory (A) 901 during preparation of the inspection recipe. Thereafter, the SEM visual inspection apparatus searches the alignment dictionary image for the center position thereof in a marking routine 902, and applies a mark such as a cross mark to the alignment center position. The SEM visual inspection apparatus then stores the alignment dictionary image having the mark applied to its center position in an alignment dictionary image memory (B) 903.

Figure 10:
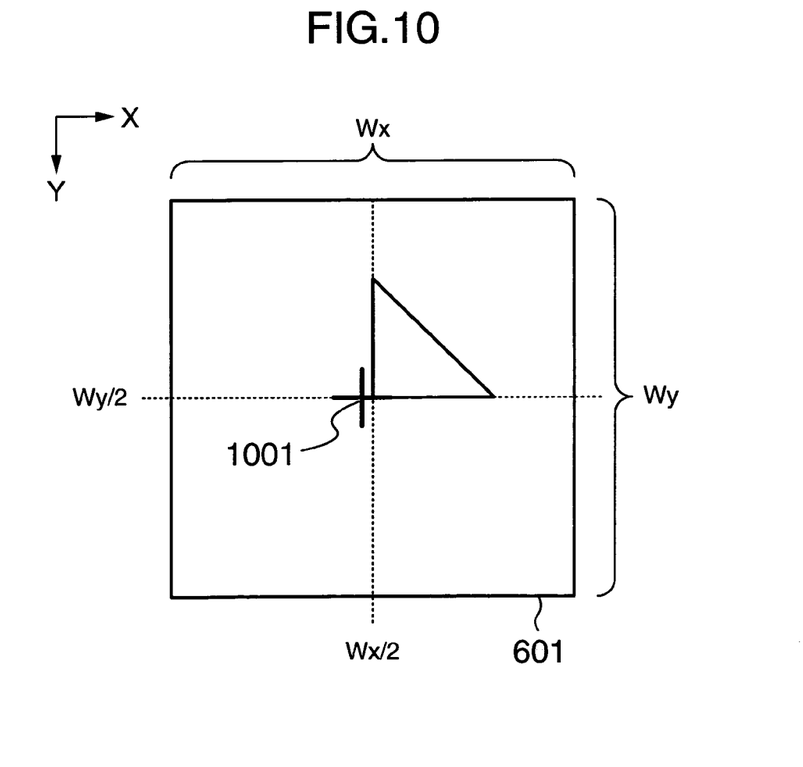
FIG. 10 is an enlargement of part of the display of the display device.

The contents of processing operations of the marking routine 902 will be explained. FIG. 10 shows a notional diagram of the operation of the marking routine. With respect to an alignment dictionary image (such as the alignment dictionary image 601 of the optical image) transmitted to the marking routine, a central pixel Wx/2 in a number Wx of pixels arranged in an X direction and a central pixel Wy/2 in a number Wy of pixels arranged in a Y direction are measured, and a mark 1001 is applied to a pixel corresponding to an intersection between vertical and horizontal lines Wx/2 and Wy/2.

In the step 306, next, at the second alignment point, the SEM visual inspection apparatus searches for the same pattern as the alignment pattern 503 of the optical microscope image specified at the first alignment point, and stores only the alignment coordinate of the optical microscope image using the same procedure. The extraction operations of the alignment coordinate information of the optical microscope image at the first and second alignment points, the offset information from the alignment coordinate of the optical microscope image to the alignment coordinate of the SEM image, and the alignment dictionary images of the optical microscope image and SEM image, as the alignment information to be transmitted from the SEM visual inspection apparatus to the review apparatus, have been completed at this stage.

Figure 11:
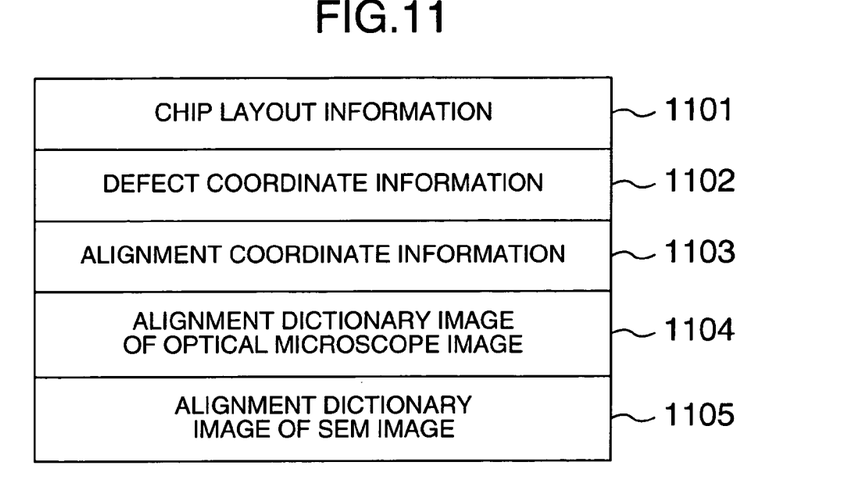
FIG. 11 shows a structure of alignment information stored in a memory.

Explanation will next be made as to how the SEM visual inspection apparatus transmits the alignment information and the inspected result to the review apparatus in the step 205. FIG. 11 shows a structure of the alignment information stored in a memory (not shown) of the SEM visual inspection apparatus. The SEM visual inspection apparatus finishes its inspecting operation, applies the alignment information to the inspected result, and then transmits the result-applied information to the review apparatus.

The contents of the inspected result having the alignment information applied thereto to be transmitted from the SEM visual inspection apparatus to the review apparatus contains, in addition to chip layout information 1101 of the semiconductor sample and defect coordinate information 1102 so far included even in a prior art inspected result, alignment coordinate information 1103, an alignment dictionary image 1104 of the optical microscope image, and an alignment dictionary image 1105 of the SEM image newly added in the present invention. The alignment coordinate information 1103 was included even in the prior art inspected result. However, the alignment coordinate information included in the prior art inspected result includes the alignment coordinate information of the SEM image at the first and second alignment points and an offset from the alignment coordinate of the SEM image to the chip origin (defect coordinate origin); whereas, the alignment coordinate information in the present invention includes two pieces of information which follow. That is, the alignment coordinate information in the present invention includes the alignment coordinate information of the optical microscope image at the first and second alignment points and the offset information from the alignment coordinate of the SEM image to the alignment coordinate of the optical microscope image. In this connection, the alignment coordinate information also includes the offset from the alignment coordinate of the SEM image to the chip origin (defect coordinate origin) applied even in the prior art.

Figure 12:
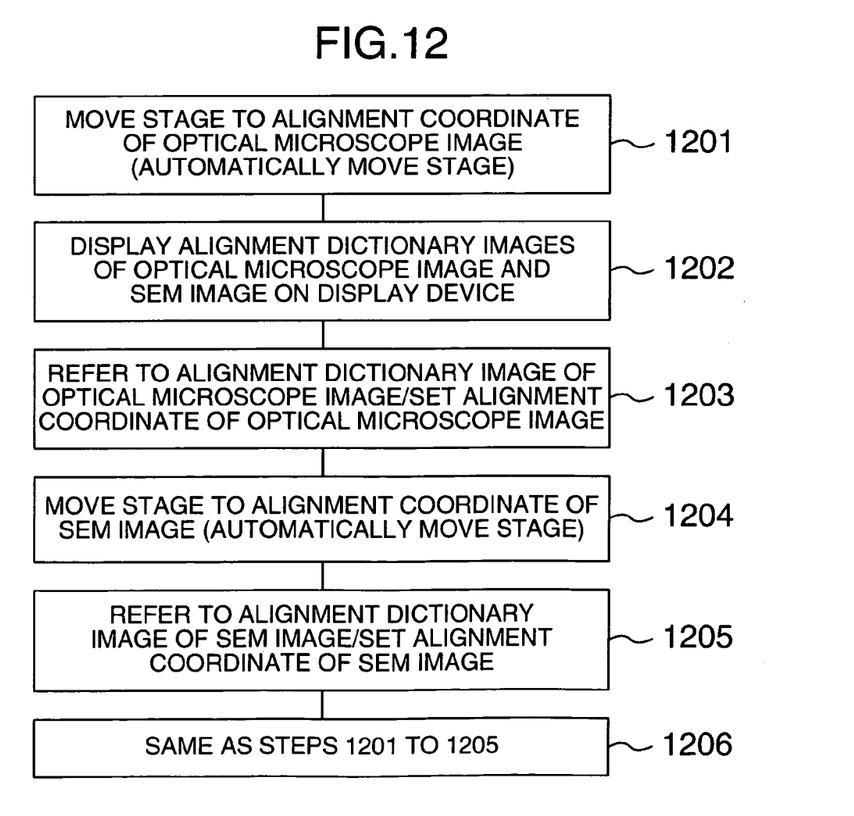
FIG. 12 is a flow chart showing alignment operations.
Figure 13:
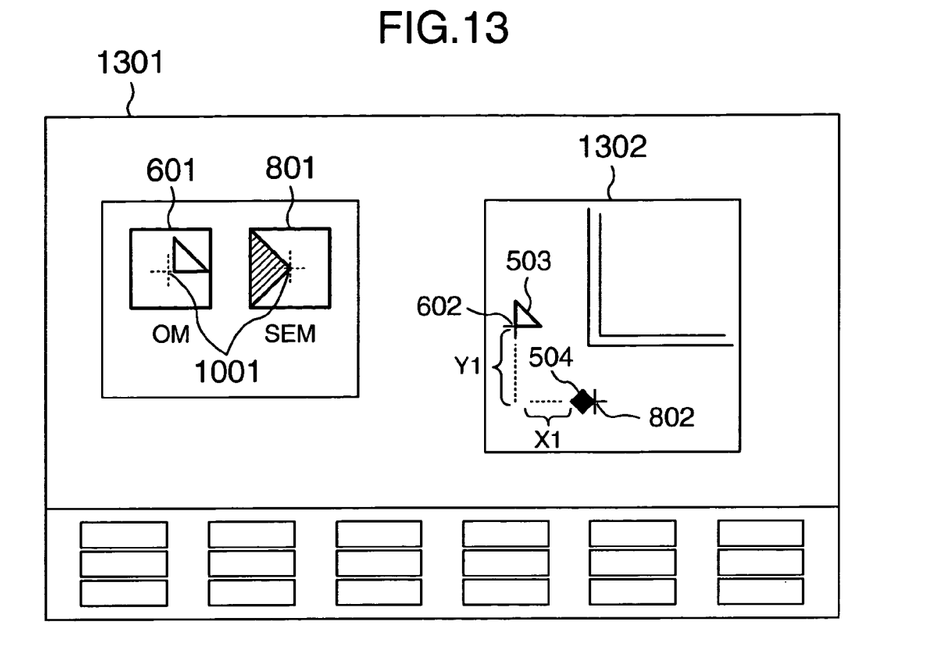
FIG. 13 shows an exemplary display of a display device in a review apparatus.
Figure 14:
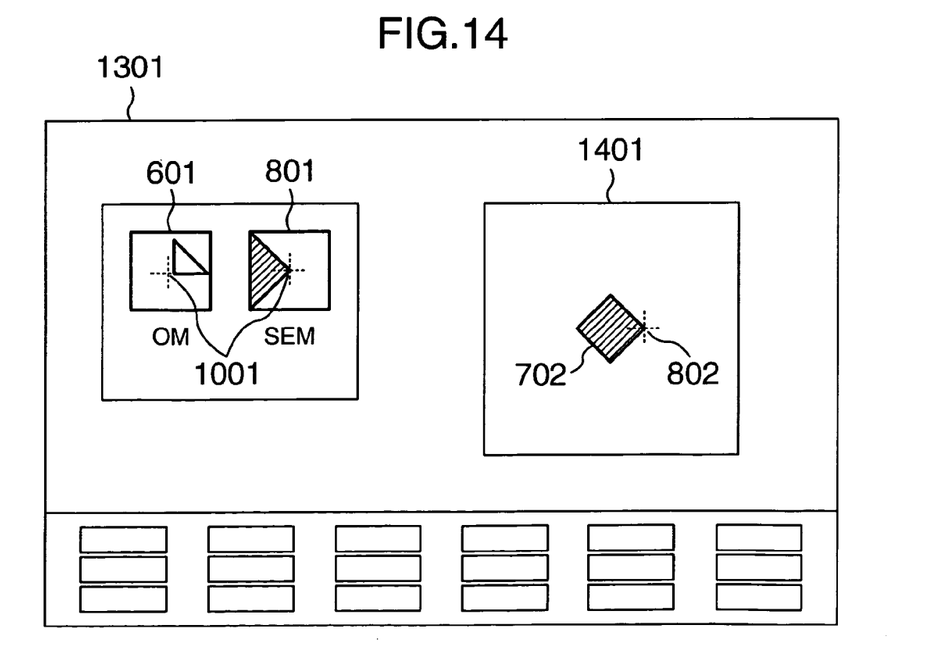
FIG. 14 another exemplary display of the display device in the review apparatus.

The alignment operation of the review apparatus shown in the step 206 will be then explained. FIG. 12 is a flow chart showing details of the contents of the alignment operations of the review apparatus shown in the step 206. FIGS. 13 and 14 are exemplary screen displays of the display device of the review apparatus.

Processing steps 1201 to 1205 show the operations at the first alignment point. In the step 1201, the stage of the review apparatus is moved under automatic control to the alignment coordinate 602 of the optical microscope image at the first alignment point 401 received from the SEM visual inspection apparatus. At this time, an optical microscope image 1302 of the first alignment point 401 as a movement destination is displayed on a display device 1301 of the review apparatus. In the step 1202, the alignment dictionary image 601 of the optical microscope image and the alignment dictionary image 801 received from the SEM visual inspection apparatus are displayed on the display device 1301 of the review apparatus. In the step 1203, the review apparatus refers to the alignment dictionary image 601 of the optical microscope image displayed on the display device 1301 of the review apparatus, searches for the alignment pattern 503 of the same optical microscope image on the optical microscope image 1302, and sets a point corresponding to the mark 1001 indicative of the alignment center marked in the alignment dictionary image 601 of the optical microscope image in the form of the alignment coordinate 602 of the optical microscope image.

In the step 1204, on the basis of the offset information (X1 and Y1 in FIG. 5) from the alignment coordinate of the optical microscope image to the alignment coordinate of the SEM image received from the SEM visual inspection apparatus, the stage is moved to the alignment coordinate 802 of the SEM image under automatic control, and the display screen is switched to a SEM image display screen 1401. In this connection, when the first SEM image is previously set to have a low display magnification, even a large amount of rotation in the semiconductor sample enables observation of a desired pattern on the SEM image display screen 1401.

In the step 1205, the operator of the review apparatus refers to the alignment dictionary image 801 of the SEM image displayed on the display device 1301, and searches the SEM image display screen 1401 for a corresponding alignment pattern of the SEM image. After confirming the alignment point of the SEM image, the operator sets a point corresponding to the mark 1001 indicative of the alignment center position displayed in the alignment dictionary image 801 in the form of the alignment coordinate 802 of the SEM image. In this connection, when the operator can confirm the alignment pattern of the SEM image to be set, he may increase the display magnification.

The step 1206 shows the operations at the second alignment point. In the step, the stage is moved to the second alignment point 402 under automatic control. Thus the operator specifies the alignment coordinate of the SEM image through operations similar to the steps 1201 to 1205 at the first alignment point. In this manner, the alignment of the review apparatus can be realized reliably and efficiently by referring to the alignment dictionary image and starting from the alignment point of the optical microscope image with a low magnification.

As has been explained in the foregoing, in accordance with the embodiment of the present invention, the operator of the review apparatus can conduct defect coordinate alignment of the semiconductor sample with use of the SEM visual inspection apparatus, all by himself, and can observe the defective part in the semiconductor sample detected by the SEM visual inspection apparatus at a high resolution.

In accordance with the present invention, there is provided an inspection system in which the operator can easily and reliably observe the defect detected by the SEM visual inspection apparatus with use of the review apparatus having a high resolution and can easily track down the cause of the defect in the semiconductor sample.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A SEM visual inspection apparatus comprising a transmitter for transmitting position information about a defect detected based on a signal generated by applying an electron beam to a semiconductor sample and an alignment dictionary image set comprising at least one SEM alignment dictionary image and at least one optical microscope dictionary image using an inspection recipe set before the defect is detected, to a review apparatus which observes the defect.

2. The SEM visual inspection apparatus as set forth in claim 1, wherein a mark indicative of an alignment position center is applied to the alignment dictionary image to be transmitted to said review apparatus.

3. The SEM visual inspection apparatus as set forth in claim 1, wherein alignment coordinates of an optical microscope image of the SEM visual inspection apparatus at first and second alignment points as well as offset information from the alignment coordinates of the optical microscope image to an alignment coordinate of an electron beam image are transmitted from said SEM visual inspection apparatus to said review apparatus.

4. A review apparatus comprising,
   a means of displaying on a display device an alignment dictionary image received from a SEM visual inspection apparatus which extracted a defect in a semiconductor sample; and
   a controller for referring to information on the alignment dictionary image and alignment coordinate information received from said SEM visual inspection apparatus and automatically moving a stage having said semiconductor sample mounted thereon so that said defect is positioned in the vicinity of an alignment coordinate.

5. A method for setting an alignment coordinate comprising the steps of:
   automatically moving an optical microscope from a semiconductor or a stage having a semiconductor sample mounted thereon to a vicinity of an alignment coordinate of an electron beam image;
   displaying an alignment dictionary image received from a SEM visual inspection apparatus on a display device; and
   confirming an alignment point by referring to the alignment dictionary image.

* * * * *